United States Patent
Sohn et al.

(10) Patent No.: US 8,852,972 B2
(45) Date of Patent: Oct. 7, 2014

(54) SEMICONDUCTOR LIGHT EMITTING DEVICE AND METHOD OF MANUFACTURING THE SAME

(71) Applicant: Samsung Electronics CO., Ltd., Suwon-si (KR)

(72) Inventors: Jong Rak Sohn, Gyeonggi-do (KR); Dong Kyun Yim, Seoul (KR); Seul Gee Lee, Gyeonggi-do (KR); Chul Soo Yoon, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/769,132

(22) Filed: Feb. 15, 2013

(65) Prior Publication Data

US 2013/0214312 A1 Aug. 22, 2013

(30) Foreign Application Priority Data

Feb. 17, 2012 (KR) .................. 10-2012-0016455

(51) Int. Cl.
*H01L 21/00* (2006.01)
*H01L 33/50* (2010.01)

(52) U.S. Cl.
CPC ............. *H01L 33/50* (2013.01); *H01L 33/507* (2013.01); *H01L 2933/0041* (2013.01)
USPC ............... 438/26; 438/22; 438/27; 438/29; 257/40; 257/72; 257/76; 257/88; 257/96; 257/98

(58) Field of Classification Search
CPC ............................ H01L 33/50; H01L 33/507
USPC .......... 257/40, 72, 76, 88, 96, 98; 438/22, 26, 438/27, 29
See application file for complete search history.

(56) References Cited

U.S. PATENT DOCUMENTS

| 8,394,654 B2 * | 3/2013 | Aliyev ............................ 438/29 |
| 2004/0121502 A1 | 6/2004 | Summers et al. |
| 2012/0132944 A1* | 5/2012 | Hsieh et al. ...................... 257/98 |

FOREIGN PATENT DOCUMENTS

JP 2006-210491 A 8/2006

* cited by examiner

*Primary Examiner* — Kyoung Lee
*Assistant Examiner* — Ratisha Mehta
(74) *Attorney, Agent, or Firm* — McDermott Will & Emery LLP

(57) ABSTRACT

A method of manufacturing a semiconductor light emitting device, includes forming a conductive film on a surface of a semiconductor light emitting element. Phosphor particles are charged by mixing phosphor particles with an electrolyte having a metallic salt dissolved therein. The semiconductor light emitting element having the conductive film formed thereon is immersed in the electrolyte having the charged phosphor particles. A phosphor layer on the conductive film is formed by electrophoresing the phosphor particles. The conductive film is removed using wet etching.

13 Claims, 5 Drawing Sheets

SEMICONDUCTOR LIGHT EMITTING DEVICE AND METHOD OF MANUFACTURING THE SAME

CROSS-REFERENCE TO RELATED APPLICATION

This application claims benefit of priority to Korean Patent Application No. 10-2012-0016455 filed on Feb. 17, 2012, in the Korean Intellectual Property Office, the entire contents of which are hereby incorporated by reference.

TECHNICAL FIELD

The present inventive concept relates to a method of manufacturing a semiconductor light emitting device, and more particularly, to a method of manufacturing a semiconductor light emitting device including formation of a phosphor layer using electrophoresis and a semiconductor light emitting device manufactured thereby.

BACKGROUND

Light emitting diodes (LEDs) are semiconductor devices that convert electrical energy into optical energy and are formed of compound semiconductors that are able to emit light having a certain wavelength according to energy bandgaps thereof. The applications of LEDs range from display devices, such as optical communications and mobile display devices, computer monitors and backlight units for liquid crystal displays (LCDs), to general illumination apparatuses.

In a well-known method, conventional light emitting devices have been manufactured by applying a mixture of phosphor particles and transparent resin to LED chips or surrounding areas thereof to allow white light to be emitted. In this case, an amount of phosphor particles to be transmitted according to an optical path of light is altered, thereby causing a change in color characteristics (e.g., color temperature and the like) of white light.

In order to provide a uniform phosphor layer, a method of dispersing charged phosphor particles in an electrolyte and forming a phosphor layer having a relatively uniform thickness in a desired region using electrophoresis has recently been used. A conductive film may be formed on a surface of an LED chip in order to define the region in which the phosphor layer is formed using electrophoresis. However, such a conductive film may deteriorate light extraction efficiency. Furthermore, the phosphor layer formed by electrophoresis may have relatively low mechanical strength, and thus the phosphor layer may be easily damaged.

SUMMARY

An aspect of the present inventive concept relates to a semiconductor light emitting device and a method of manufacturing the same in which a phosphor layer is formed using electrophoresis, while light loss due to a conductive film is reduced.

An aspect of the present inventive concept encompasses a method of manufacturing a semiconductor light emitting device, including forming a conductive film on a surface of a semiconductor light emitting element. Phosphor particles are charged by mixing phosphor particles with an electrolyte having a metallic salt dissolved therein. The semiconductor light emitting element having the conductive film formed thereon is immersed in the electrolyte having the charged phosphor particles. A phosphor layer is formed on the conductive film by electrophoresing the phosphor particles. The conductive film is removed using wet etching.

The conductive film may be a metallic film, and the wet etching may be performed using an acidic solution as an etchant.

The method may further include bonding the semiconductor light emitting element to a package substrate having an electrode connection part using a flip-chip bonding method before the forming of the conductive film.

The surface of the semiconductor light emitting element on which the conductive film is formed may include a lower surface of a substrate of the semiconductor light emitting element. The surface of the semiconductor light emitting element on which the conductive film is formed may further include side surfaces of the semiconductor light emitting element.

The method may further include forming a resin encapsulating part enclosing the semiconductor light emitting element after the removing of the conductive film.

The resin encapsulating part may include liquid resin, and the liquid resin may fill at least a portion of a gap between the semiconductor light emitting element and the phosphor layer created by the removing of the conductive film.

The method may further include performing a heat treatment for stabilizing the phosphor layer. The electrolyte having the metallic salt dissolved therein may further include a phosphor binder, and the phosphor binder may be a sol formed of at least one selected from the group consisting of Pt, Al, $Al_2O_3$ and $SiO_2$.

The heat treatment may be performed at a temperature of 100° C. to 700° C. The heat treatment may be performed before the removing of the conductive film.

Another aspect of the present inventive concept relates to a semiconductor light emitting device including: a semiconductor light emitting element; and a phosphor layer disposed on a surface of the semiconductor light emitting element. A gap exists between the phosphor layer and the surface of the semiconductor light emitting element.

The semiconductor light emitting device may further include a package substrate having an electrode connection part, and the semiconductor light emitting element may be disposed on the package substrate.

The semiconductor light emitting element may include a substrate, and the phosphor layer may be disposed on a lower surface of the substrate of the semiconductor light emitting element.

Alternatively, the semiconductor light emitting element may include a substrate, and the phosphor layer may be disposed on a lower surface of the substrate of the semiconductor light emitting element and side surfaces of the semiconductor light emitting element.

The semiconductor light emitting device may further include a resin encapsulating part enclosing the semiconductor light emitting element. The resin encapsulating part may be disposed to fill at least a portion of the gap between the semiconductor light emitting element and the phosphor layer.

Still another aspect of the present inventive concept encompasses a method of manufacturing a semiconductor light emitting device, including forming a conductive film on a surface of a semiconductor light emitting element. The semiconductor light emitting element having the conductive film formed thereon immersed in an electrolyte having charged phosphor particles. A phosphor layer on the conductive film is formed by electrophoresing the phosphor particles. A heat treatment is performed for stabilizing the phosphor layer. The conductive film is removed using wet etching.

In immersing the semiconductor light emitting element, a metallic salt may be dissolved in the electrolyte, and the phosphor particles may be charged by mixing the phosphor particles with the electrolyte having the metallic salt dissolved therein.

BRIEF DESCRIPTION OF THE DRAWINGS

The foregoing and other features of the inventive concept will be apparent from more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept. In the drawings, the thickness of layers and regions may be exaggerated for clarity.

DETAILED DESCRIPTION

Figure 1:
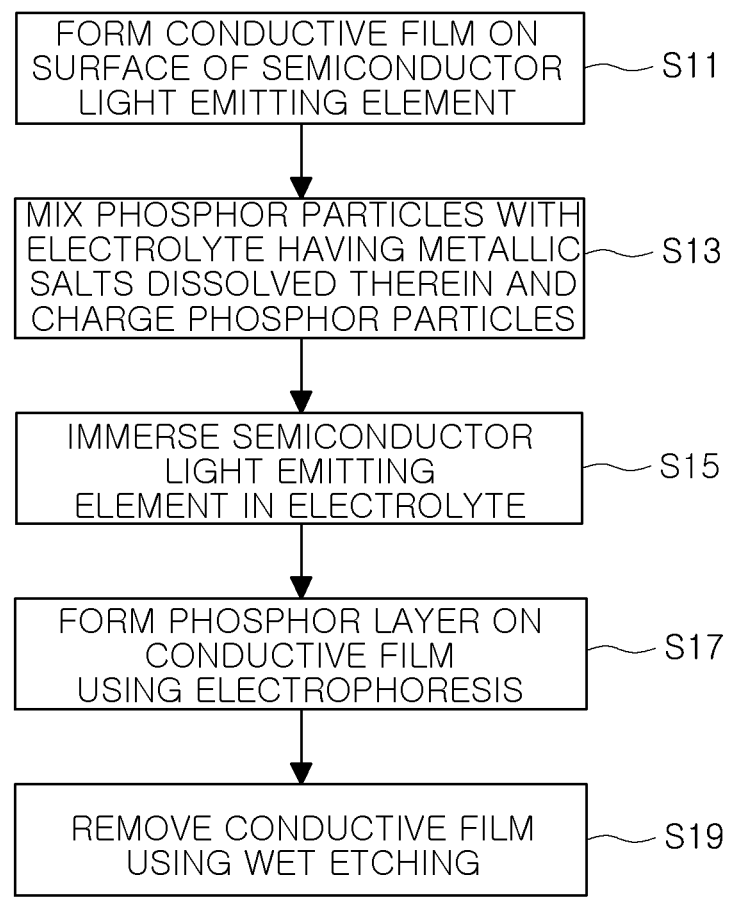
FIG. 1 is a flowchart illustrating a method of manufacturing a semiconductor light emitting device according to an embodiment of the present inventive concept.

Examples of the present inventive concept will be described below in more detail with reference to the accompanying drawings. The examples of the present inventive concept may, however, be embodied in different forms and should not be construed as limited to the examples set forth herein. Like reference numerals may refer to like elements throughout the specification.

FIG. 1 is a flowchart illustrating a method of manufacturing a semiconductor light emitting device according to an embodiment of the present inventive concept.

As illustrated in FIG. 1, a conductive film may first be formed on a surface of a semiconductor light emitting element in operation S11.

The conductive film formed in operation S11 defines a region for a phosphor layer to be formed on the surface of the semiconductor light emitting element. The conductive film may be a metallic film or a conductive oxide film. For example, the metallic film may be formed of aluminum (Al), tantalum (Ta), tin (Sn) or alloys thereof, and the conductive oxide film may be formed of ITO or ZnO. The conductive film may have a thickness of 1 nm to 50 nm.

The conductive film may be formed by E-beam deposition, sputtering, plating or the like.

An electrolyte may be prepared for formation of the phosphor layer, in operation S13. That is, phosphor particles may be mixed with the electrolyte having a metallic salt dissolved therein such that the phosphor particles may be charged using the metallic salt.

In this charging operation, the metallic salt may apply charges to surfaces of the phosphor particles mixed with the electrolyte. The electrolyte used in this charging operation may be an alcohol-based electrolyte such as ethanol, methanol, isopropyl alcohol or the like. A small amount of metallic salts (for example, 0.01 wt % to 10 wt %) may be dissolved in the electrolyte. The metallic salt may include a magnesium (Mg) salt, an yttrium (Y) salt, a sodium (Na) salt or the like or a combination thereof.

Then, in operation S15, the semiconductor light emitting device having the conductive film formed thereon may be immersed in the electrolyte containing the charged phosphor particles, and the phosphor layer may be formed on the conductive film by electrophoresis in operation S17.

In this manner, the desired phosphor layer may be formed on the conductive film by immersing the semiconductor light emitting element in the electrolyte containing the charged phosphor particles, applying, to the conductive film, a voltage having a polarity opposite to a polarity of the charged phosphor particles, and electrophoresing the phosphor particles.

Next, the conductive film may be removed using wet etching in operation S19. An etchant used in the wet etching process may be selected from appropriate materials that are able to remove the conductive film through selective reaction to the material of the conductive film. For example, when the conductive film is a metallic film, an acidic solution may be used as an etchant in the wet etching process.

Such an etchant reaches the conductive film by permeating into spaces between the phosphor particles of the phosphor layer formed by the electrophoresis process such that the etchant reacts with the conductive film to thereby remove the conductive film. Since the conductive film used in the electrophoresis process is very thin, the conductive film may be removed by a small amount of etchant permeated into the phosphor layer.

Even in the case that the conductive film for the electrophoresis process is formed as a thin metallic film or a conductive oxide film having light transmissivity, a certain amount of light loss is inevitable during the transmission of light. Therefore, a fundamental cause of light loss, e.g., the conductive film, is eliminated through this process, e.g., operation S19, whereby light extraction efficiency may be improved to thereby contribute to enhanced light emitting efficiency.

Figure 2:
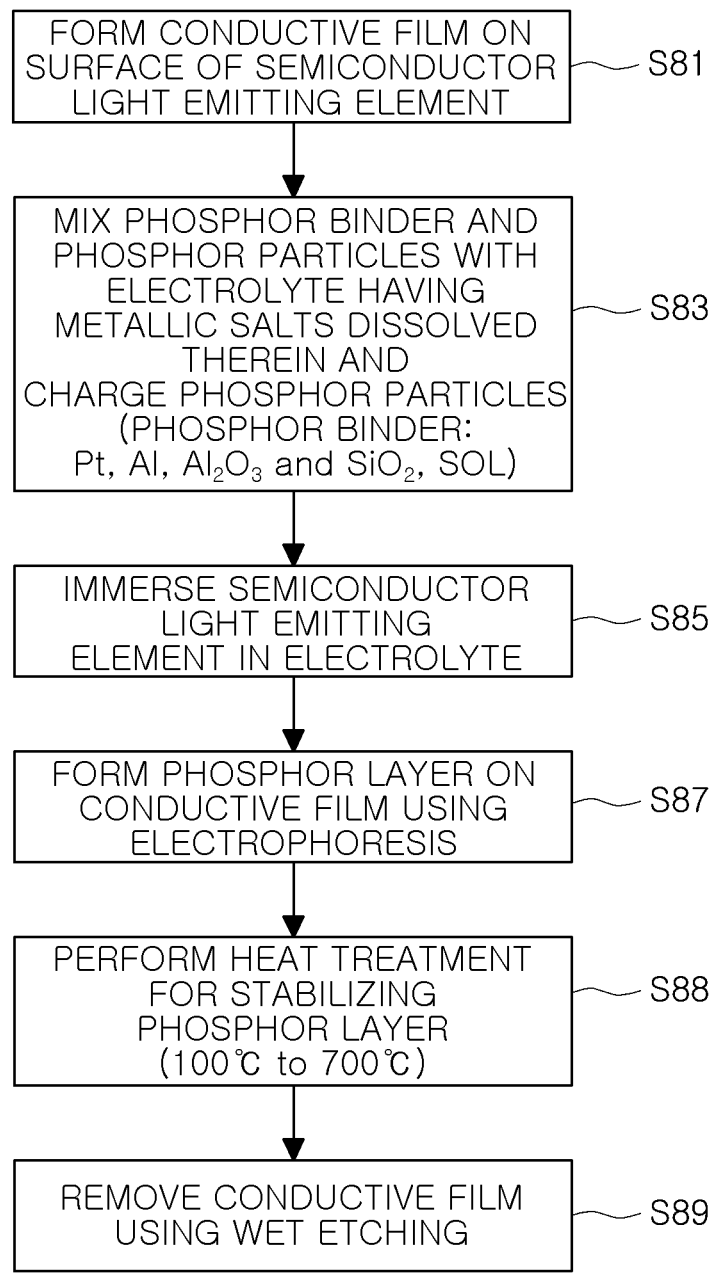
FIG. 2 is a flowchart illustrating a method of manufacturing a semiconductor light emitting device according to another embodiment of the present inventive concept.

FIG. 2 is a flowchart illustrating a method of manufacturing a semiconductor light emitting device according to another embodiment of the present inventive concept.

A method of manufacturing a semiconductor light emitting device according to another embodiment of the present inventive concept will be described with reference to main processes illustrated in cross-sectional views of FIGS. 3 through 5. That is, the method of manufacturing a semiconductor light emitting device according to an embodiment of the present inventive concept is described with regard to a flip-chip semiconductor light emitting device, e.g., that illustrated in FIG. 3.

Figure 3:
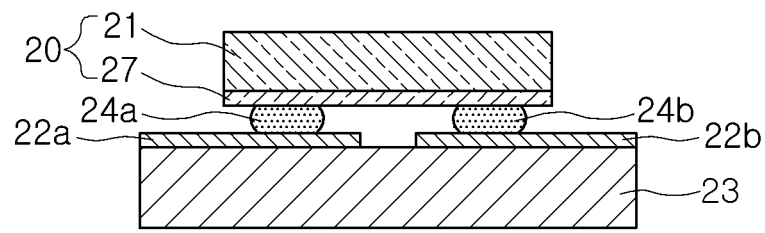
FIGS. 3 through 6 are cross-sectional views illustrating main processes in the method of manufacturing a semiconductor light emitting device of FIG. 2.

As shown in FIG. 3, a semiconductor light emitting element 20 may be bonded to a package substrate 23 having electrode connection parts 22a and 22b using a flip-chip bonding method, whereby a flip-chip semiconductor light emitting device 30 is prepared.

Figure 7:
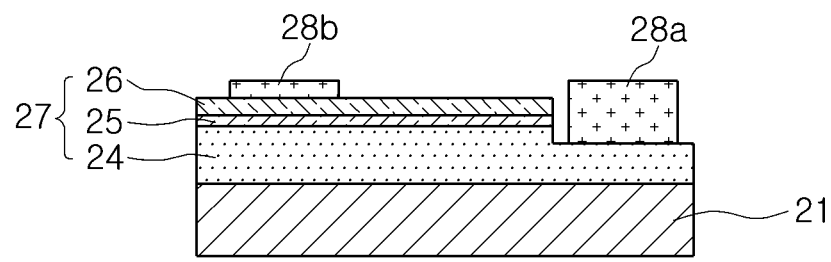
FIG. 7 is a cross-sectional view illustrating a semiconductor light emitting element of FIG. 3.

FIG. 3 schematically shows that the semiconductor light emitting element 20 includes a substrate 21 and a semiconductor layer 27 formed on the substrate 21. However, as shown in FIG. 7, the semiconductor light emitting element 20 may be an LED chip including a first conductivity type semiconductor layer 24, an active layer 25 and a second conductivity type semiconductor layer 26 formed on the substrate 21, which may be a light-transmissive insulating substrate. Furthermore, the semiconductor light emitting element 20, as illustrated in FIG. 7, may include first and second electrodes 28a and 28b connected to the first and second conductivity type semiconductor layers 24 and 26, respectively.

Referring to FIG. 7, the semiconductor light emitting element 20 according to an embodiment of the present inventive concept has a flip-chip structure, in which the first and second electrodes 28a and 28b are disposed toward one surface of the semiconductor light emitting element 20. The first and second electrodes 28a and 28b may be connected to the electrode connection parts 22a and 22b of the package substrate 23 via bump balls 24a and 24b (see FIG. 3).

Figure 4:
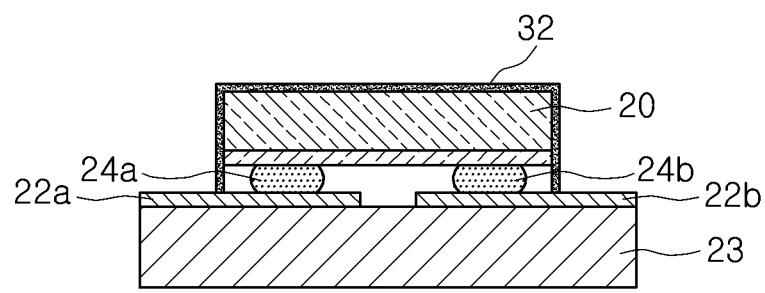

Referring to FIGS. 2 and 4, in operation S81, a conductive film 32 may be formed on a surface of the semiconductor light emitting element 20 as shown in FIG. 3.

Referring to FIG. 4, the conductive film 32 defines a region in which a phosphor layer will be formed. The conductive film 32 may be formed on a lower surface of the substrate 21 of the semiconductor light emitting element 20 (that is, a surface of the semiconductor light emitting element 20 opposing to a surface thereof on which the semiconductor layer 27 is formed) and side surfaces of the semiconductor light emitting element 20.

The conductive film 32 may be a metallic film or a conductive oxide film. For example, the metallic film may be formed of aluminum (Al), tantalum (Ta), tin (Sn) or alloys thereof, and the conductive oxide film may be formed of ITO or ZnO. The conductive film 32 may have a thickness of 1 nm to 50 nm. The conductive film 32 may be formed by E-beam deposition, sputtering, plating or the like Next, in operation S83 (see FIG. 2), phosphor particles may be mixed with an electrolyte having a metallic salt dissolved therein. A phosphor binder AS may be further mixed with the electrolyte having the metallic slat dissolved therein. The phosphor particles mixed with the electrolyte may be charged using the metallic salt. The electrolyte may be an alcohol-based electrolyte such as ethanol, methanol, isopropyl alcohol or the like. Here, the metallic salt may include a magnesium (Mg) salt, an yttrium (Y) salt, a sodium (Na) salt or the like or a combination thereof.

The phosphor binder AS used in an embodiment of the present inventive concept may be a sol formed of at least one selected from platinum (Pt), aluminum (Al), $Al_2O_3$ and $SiO_2$. The sol is not limited thereto, and the sol may be added in an amount of 0.1 wt % to 10 wt % with respect to the electrolyte. The phosphor binder AS (see FIG. 5), together with the phosphor particles, is moved to the conductive film 32 during an electrophoresis process, e.g., operation S87, such that the phosphor binder AS may allow the phosphor particles to be bonded to each other to thereby promote cohesion in a phosphor layer.

Then, the semiconductor light emitting element may be immersed in the prepared electrolyte in operation S85, and the phosphor layer may be formed on the conductive film through electrophoresis in operation S87.

Figure 5:
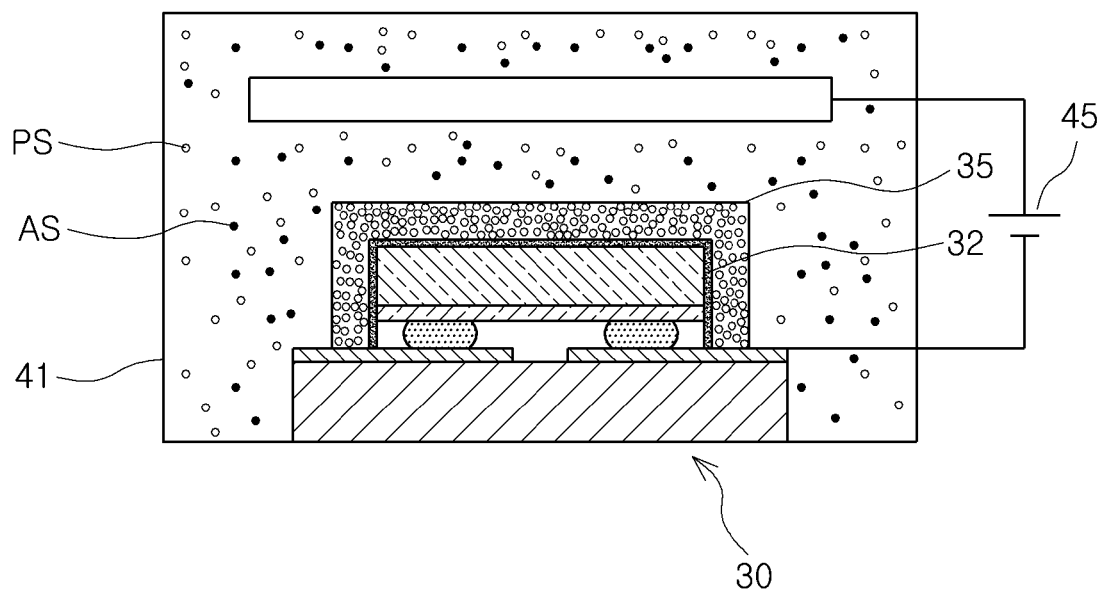

That is, as shown in FIG. 5, the semiconductor light emitting device 30 may be immersed in an electrolytic bath 41 in which the electrolyte containing the charged phosphor particles PS and the phosphor binder AS is contained. A metallic plate may be provided to be disposed opposite to the semiconductor light emitting device 30, and a voltage having the same polarity as a polarity of the charged phosphor particles PS may be applied, as a first voltage application method, to the metallic plate using a DC power supply 45. Alternatively, the electrophoresis process may be performed by a second voltage application method, i.e., applying a voltage having a polarity opposite to a polarity of the charged phosphor particles PS to the conductive film 32. Alternatively, the first and second voltage application methods may be performed simultaneously.

Due to the electrophoresis process, e.g., operation S87, the phosphor binder AS, together with the phosphor particles PS, may be moved and bonded to the conductive film of the semiconductor light emitting device 30. In this manner, a desired phosphor layer 35 (see FIG. 5) may be formed on the conductive film 32. The phosphor layer 35 formed by the electrophoresis process may have a relatively uniform thickness determined according to a voltage applied thereto, voltage application time, and the distribution of the phosphor particles.

Thereafter, a heat treatment may be performed for stabilizing the phosphor layer in operation S88. The phosphor binder AS may fix the phosphor particles through the heat treatment, whereby the phosphor layer may be stabilized. The heat treatment may be performed at a temperature of 100° C. to 700° C.

Then, the conductive film 32 may be removed by wet etching in operation S89.

An etchant used in the wet etching process may be selected from appropriate materials that are able to remove the conductive film 32 through selective reaction to the material of the conductive film. For example, when the conductive film is a metallic film, an acidic solution may be used as an etchant in the wet etching process. In this case, the acidic solution may be hydrochloric acid, nitric acid, sulfuric acid, or a mixture thereof.

However, in the case that the acidic solution is used, the acidic solution may have a low concentration in order not to deform the phosphor layer 35. For example, the concentration of the acidic solution may be 20 wt % or less with respect to the electrolyte. Meanwhile, in order to react with the conductive film 32, the acidity may be at least 0.1 wt % or greater with respect to the electrolyte.

Such an etchant reaches the conductive film by permeating into spaces between the phosphor particles of the phosphor layer 35 formed by the electrophoresis process so that the etchant reacts with the conductive film to thereby remove the conductive film. Since the conductive film used in the electrophoresis process is very thin, the conductive film may be removed by a small amount of etchant permeated into the phosphor layer 35.

Even in the case that the conductive film 32 for the electrophoresis process is formed as a thin metallic film or a conductive oxide film having light transmissivity, a certain amount of light loss is inevitable during the transmission of light. Therefore, a fundamental cause of light loss, e.g., the conductive film 32, is eliminated through this process, e.g., operation 89, whereby light extraction efficiency may be improved to thereby contribute to enhanced light emitting efficiency.

Meanwhile, the heat treatment in operation S88 may be performed before the removal of the conductive film 32 in order to stabilize the phosphor layer 35, even in the case that a gap may be created in a place where the conductive film 32 is removed.

Figure 6:
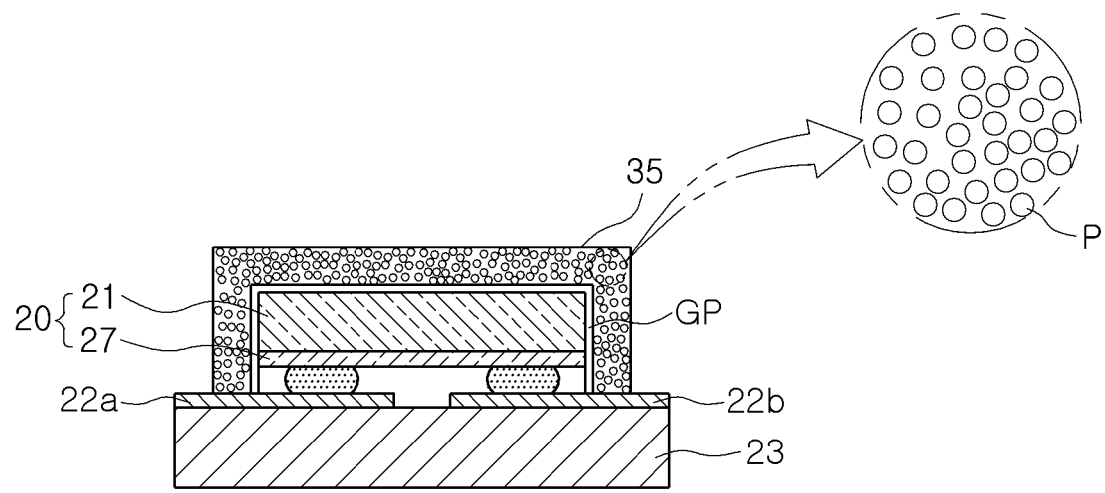

As described above, referring to FIG. 6, in the case in which the conductive film is removed in order to improve light extraction efficiency, a micro gap GP may be created between the surface of the semiconductor light emitting element 20 and the phosphor layer 35. At least a portion of the micro gap may be filled with a resin material identical to a resin material of a resin encapsulating part to be formed later.

Figure 8:
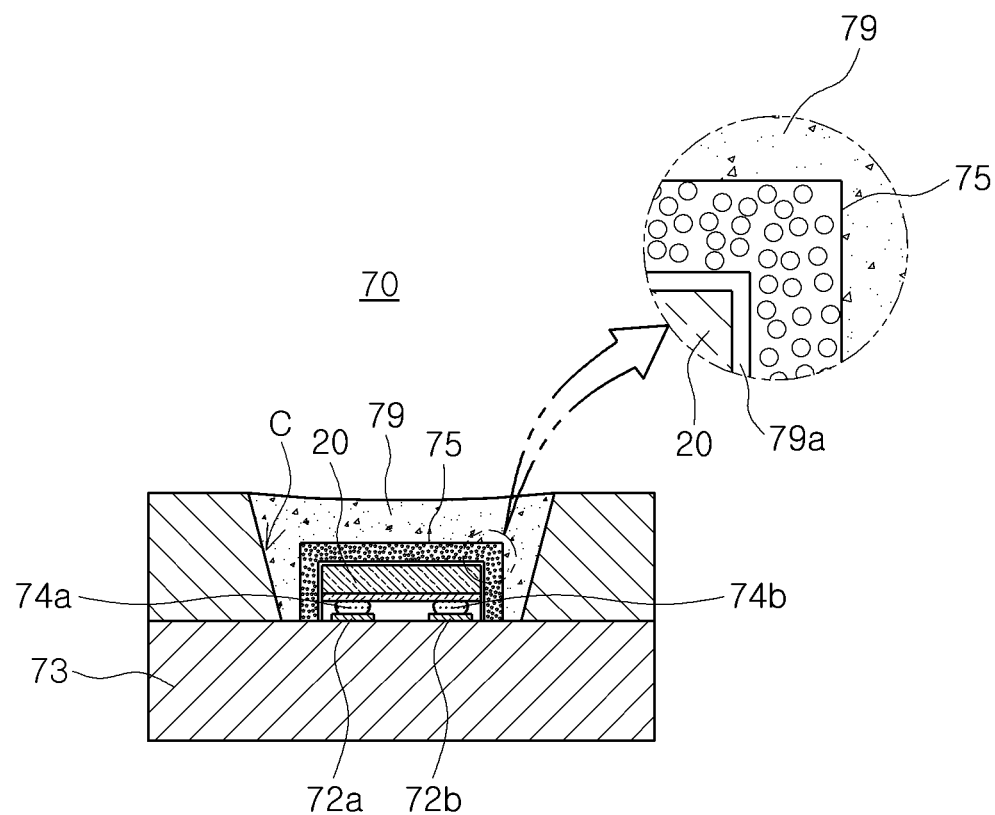
FIG. 8 is a cross-sectional view illustrating a semiconductor light emitting device according to an embodiment of the present inventive concept.

FIG. 8 is a cross-sectional view illustrating a semiconductor light emitting device according to an embodiment of the present inventive concept.

A semiconductor light emitting device 70 shown in FIG. 8 may include a semiconductor light emitting element 20 and a phosphor layer 75 formed by performing electrophoresis on a surface of the semiconductor light emitting element 20. The phosphor layer 75 may be spaced apart from the surface of the semiconductor light emitting element 20.

The semiconductor light emitting device 70 may further include a package main body 73 having electrode connection parts 72a and 72b. The package main body 73 may have a cavity C providing a space for mounting the semiconductor light emitting element 20.

The semiconductor light emitting element 20 may be mounted on the package main body 73 using a flip-chip bonding method, and the bump balls 74a and 74b may be connected to the electrode connection parts 72a and 72b of the package main body 73. In the flip-chip bonding structure according to an embodiment of the present inventive concept, the phosphor layer 75 may be formed to surround a lower surface of a substrate of the semiconductor light emitting element 20 and side surfaces of the semiconductor light emitting element 20.

A resin encapsulating part 79 may be formed in the cavity C so as to protect the semiconductor light emitting element 20. A portion 79a of the resin encapsulating part may also be formed in a gap between the semiconductor light emitting element 20 and the phosphor layer 75. That is, during the formation of the resin encapsulating part 79, liquid resin may permeate into spaces between phosphor particles of the phosphor layer 75 and fill at least a portion of the gap between the semiconductor light emitting element 20 and the phosphor layer 75. In this manner, at least a portion of the gap may be filled with the liquid resin of the resin encapsulating part 79, thereby enhancing structural stability of the phosphor layer 75.

As set forth above, according to embodiments of the present inventive concept, a phosphor layer is formed using electrophoresis and a conductive film is removed in post-processing, whereby light loss due to the conductive film may be avoided. If necessary, a phosphor binder in a sol state is further dispersed in an electrolyte in order to stabilize the phosphor layer. Then, the stability of the phosphor layer may be further secured through a heat treatment.

While the present inventive concept has been shown and described in connection with the embodiments, it will be apparent to those skilled in the art that modifications and variations can be made without departing from the spirit and scope of the inventive concept as defined by the appended claims.

What is claimed is:

1. A method of manufacturing a semiconductor light emitting device, the method comprising steps of:
   forming a conductive film on a surface of a semiconductor light emitting element;
   charging phosphor particles by mixing the phosphor particles with an electrolyte having a metallic salt dissolved therein;
   immersing the semiconductor light emitting element having the conductive film formed thereon in the electrolyte having the charged phosphor particles;
   forming a phosphor layer on the conductive film by electrophoresing the phosphor particles; and
   removing the conductive film using wet etching.

2. The method of claim 1, wherein:
   the conductive film is a metallic film, and
   the wet etching is performed using an acidic solution as an etchant.

3. The method of claim 1, further comprising the step of:
   bonding the semiconductor light emitting element to a package substrate having an electrode connection part using a flip-chip bonding method before the step of forming the conductive film.

4. The method of claim 3, wherein the surface of the semiconductor light emitting element on which the conductive film is formed includes a lower surface of a substrate of the semiconductor light emitting element.

5. The method of claim 4, wherein the surface of the semiconductor light emitting element on which the conductive film is formed further includes side surfaces of the semiconductor light emitting element.

6. The method of claim 3, further comprising the step of:
   forming a resin encapsulating part enclosing the semiconductor light emitting element after the step of removing the conductive film.

7. The method of claim 6, wherein:
   the resin encapsulating part includes liquid resin, and
   the liquid resin fills at least a portion of a gap between the semiconductor light emitting element and the phosphor layer, created by the removing of the conductive film.

8. The method of claim 1, further comprising the step of:
   performing a heat treatment for stabilizing the phosphor layer,
   wherein the electrolyte having the metallic salt dissolved therein further includes a phosphor binder.

9. The method of claim 8, wherein the heat treatment is performed at a temperature of 100° C. to 700° C.

10. The method of claim 8, wherein the heat treatment is performed before the removing of the conductive film.

11. The method of claim 8, wherein the phosphor binder is a sol formed of at least one selected from the group consisting of Pt, Al, $Al_2O_3$ and $SiO_2$.

12. A method of manufacturing a semiconductor light emitting device, the method comprising steps of:
   forming a conductive film on a surface of a semiconductor light emitting element;
   immersing the semiconductor light emitting element having the conductive film formed thereon in an electrolyte having charged phosphor particles;
   forming a phosphor layer on the conductive film by electrophoresing the phosphor particles;
   performing a heat treatment for stabilizing the phosphor layer; and
   removing the conductive film using wet etching.

13. The method of claim 12, wherein the step of immersing the semiconductor light emitting element includes:
   dissolving a metallic salt in the electrolyte; and charging the phosphor particles by mixing the phosphor particles with the electrolyte having the metallic salt dissolved therein.

* * * * *